United States Patent [19]
Cohen
[11] 3,743,825
[45] July 3, 1973

[54] ILLUMINATION ASSEMBLY

[76] Inventor: Barry G. Cohen, 39 Cromwell Court, Berkeley Heights, N.Y. 07922

[22] Filed: July 13, 1971

[21] Appl. No.: 162,132

[52] U.S. Cl. .............................. 240/2 MA, 240/2 M
[51] Int. Cl. .............................................. F21v 33/00
[58] Field of Search ................ 240/2 R, 2 M, 2 MA; 95/1 R; 355/70, 113

[56] References Cited

UNITED STATES PATENTS

| | | | |
|---|---|---|---|
| R22,848 | 3/1947 | Wilder | 240/2 |
| 2,747,459 | 5/1956 | Morrison | 355/70 |
| 3,488,485 | 1/1970 | McGann | 240/2 X |
| 3,460,448 | 8/1969 | Oliver | 95/1 |

*Primary Examiner*—Samuel S. Matthews
*Assistant Examiner*—Michael L. Gellner

[57] ABSTRACT

For use in illuminating a semiconductor slice to be aligned with a patterned mask, an illumination assembly comprises a substantially cylindrical, disc-like housing having a bottom surface adapted to fit a complementary upper surface portion of a chuck member of the alignment machine. The interior of the housing is hollow and contains a plurality of infrared sources, e.g., two-terminal, incandescent infrared lamps secured along radii extending from the center of the cylinder. One terminal of each lamp is connected to a ground post located at the center and extending through the lower surface; the other terminals are passed through separate apertures in the housing wall to an annular contact ring which is secured to the outer surface of the wall. A voltage applied between the ground post and contact ring, when the chuck is in the alignment position, causes the lamps to radiate through a light transmitting element located in the top surface of the housing and on which is directly placed the semiconductor slice.

6 Claims, 4 Drawing Figures

Patented July 3, 1973 3,743,825

INVENTOR
BARRY G. COHEN
BY Frederick W. Padden
ATTORNEY

ILLUMINATION ASSEMBLY

BACKGROUND OF THE INVENTION

This invention relates to the alignment of masks to semiconductor slices and, more particularly, to an illumination assembly which provides a source of infrared illumination for use with an infrared microscope in the alignment procedure.

In the fabrication of integrated-circuit semiconductor devices patterned masks are utilized to define various regions of the device such as the base, emitter and collector of a transistor, as well as metallized leads which interconnect the components of a semiconductor circuit. It is common to utilize a plurality of such masks, one at each stage in the sequential fabrication of the various device regions. In one general technique, termed contact masking, exposure of the photoresist by ultraviolet light is made with the mask and photoresist on the slice in physical contact with one another.

In order to align the mask to previous patterns on the surface of, or inside of, the slice, the mask is separated from the slice by a distance of typically a few mils. This separation permits the patterns of the slice to be positioned precisely with respect to the corresponding patterns of the mask. This positioning of the slice and mask must often be done to an accuracy of a fraction of a mil. Moreover, after the positioning is completed, the mask and slice must be brought into contact with one another without disturbing their precise positions. Consequently, it is undesirable to modify the positioning assembly utilized to obtain such high accuracy.

In early prior art positioning arrangements, a visible microscope was used to look through the pattern on the mask. This technique was limited, however, to alignment of patterns on the upper surface of the slice, because the slice material, typically a semiconductor such as silicon, was opaque to visible radiation. Positioning was accomplished by inserting the mask in a holder fixed in space and placing the slice on a mounting device, typically a vacuum chuck, capable of being precisely translated vertically and rotated in a horizontal plane. The interface between the chuck and the translating assembly typically comprised an accurately lapped spherical surface which allowed exact parallelism between the slice and mask to be obtained, notwithstanding that the slice was not quite flat as was the usual case.

In order to overcome the aforementioned limitation of of the visible microscope, subsequent prior art techniques employed transmitted infrared (IR) illumination which permitted alignment of the mask to patterns located on the lower surface of, or interior to, the slice. In this technique IR radiation was made to transmit through the slice and mask from the bottom and was made to transmit through the slice and mask from the bottom and was then observed with an IR microscope. In these prior art IR alignment assemblies, which were bulky and imprecise, it was common to locate the source of illumination behind the chuck and translating assembly. Typically, a hole was bored all the way through the positioning assembly and an IR illuminator and lens system were used to couple IR radiation through the hole to the bottom of the slice. The boring of such a hole, however, disadvantageously required an extensive redesign of the positioning assembly with attendant higher cost. Moreover, the hole had to be made reasonably large to illuminate the slice adequately. Unfortunately, holes of appropriate size for this purpose required destruction of a significant portion of the spherical surface of the positioning assembly which, of course, deteriorated the precision of the entire apparatus.

One other problem with the latter form of IR apparatus arose from the fact that the IR illuminator had to be positioned at a relatively large distance from the slice (due to the physical separation imposed by the bulk of the positioning assembly). As a result very high intensity IR lamps were required which heated the entire alignment apparatus. The thermal gradients thereby produced were sufficiently large to interfere seriously with the precise motion of the aligner.

Another prior art illumination technique utilizes optic fibers to guide radiation through the positioning assembly to the bottom of the slice.

With either prior art IR technique, however, in order to illuminate an appreciable area of the slice, the precise mechanical components of the positioning assembly are disrupted - either by the boring of a large hole or by the inclusion of a large number of optic fibers.

It is, therefore, a broad object of my invention to provide a simple, compact and easily accessible source of infrared illumination for use in mask alignment apparatus.

It is another object of my invention to provide such a source which can be placed in close proximity to a slice to be aligned.

It is another object of my invention to illuminate the bottom of a slice to be aligned with a mask without deteriorating the precision of the positioning assembly.

It is still another object of my invention to provide a source of such illumination which is low power and yet illuminates an appreciable amount of the slice to be aligned.

It is yet another object of my invention to provide such a source which is low power so as not to introduce thermal gradients which deteriorate the precision of the positioning assembly.

SUMMARY OF THE INVENTION

These and other objects are accomplished in accordance with an illustrative embodiment of my invention, an illumination assembly comprising a substantially cylinderical housing having a hollow interior portion adapted to receive a plurality of two terminal infrared sources, such as incandescent lamps or light emitting diodes. One terminal of each source is connected to a ground post at the center and the other terminal of each source is passed through holes in the solid wall portions of the housing to an annular contact ring which surrounds, and is affixed to, the exterior of the housing. Enclosing the top of the hollow interior is a glass plate, which forms a light transmitting element window upon which is placed a semiconductor slice. When a voltage is applied between the ground post and contact ring, infrared radiation from the sources passes through the window, which may optionally be an IR filter, to illuminate the bottom of the slice. IR radiation passing through the slice (and mask) is detected by an IR microscope for alignment purposes.

My illumination assembly illustratively comprises a compact, disc-like structure the bottom of which has a portion adapted to be received by a corresponding portion in the chuck of the alignment apparatus. Importantly, in this structure illumination of the slice is achieved without disruption of the sensitive components of the positioning assembly such as the precise spherical surface which supports the chuck. In addition, very low power sources can be utilized because the illumination assembly is located in intimate contact with the slice to be aligned.

BRIEF DESCRIPTION OF THE DRAWINGS

The above and other objects of the invention, together with its various features and advantages, can be easily understood from the following more detailed discussion, taken in conjunction with the accompanying drawings, in which.

DETAILED DESCRIPTION

Figure 1:
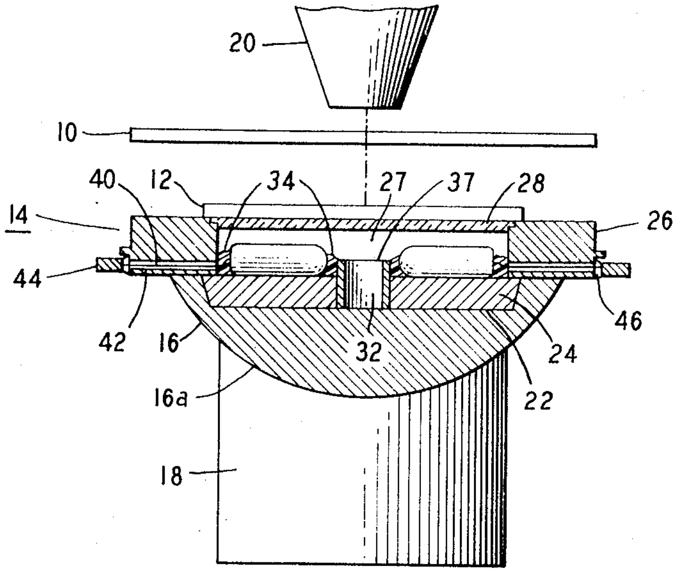
FIG. 1 is a partial cross-sectional isometric view of mask alignment apparatus employing an illumination assembly in accordance with an illustrative embodiment of my invention.

Turning now to FIG. 1, there is shown apparatus for aligning a patterned mask 10 to a semiconductor slice 12. The mask 10, by means not shown, is typically mounted in a fixed position in space whereas the slice 12 is placed on the top surface of an infrared illumination assembly 14 constructed in accordance with an illustrative embodiment of my invention to be described more fully hereinafter.

The bottom of the illumination assembly 14 is adapted to fit into the substantially planar portion of a hemispherical chuck member 16 rotatably mounted on a vertical translation assembly 18, typically a commercially available assembly sold under the tradename of Kulicke and Soffa Model 686.

Infrared radiation emitted by illumination assembly 14 is transmitted through slice 12 and mask 10 to incidence on high resolution infrared microscope 20, preferably of the vertical illumination type described in my copending application Ser. No. 6365 filed on Jan. 28, 1970. By observing the mask and slice through the microscope the two are brought into alignment by making precision adjustments in the positions of chuck member 16 and translation assembly 18.

Figure 2:
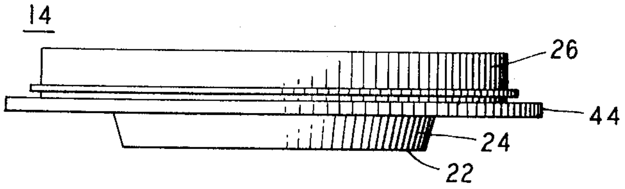
FIG. 2 is a side view of the illumination assembly shown in FIG. 1.
Figures 3, 4:
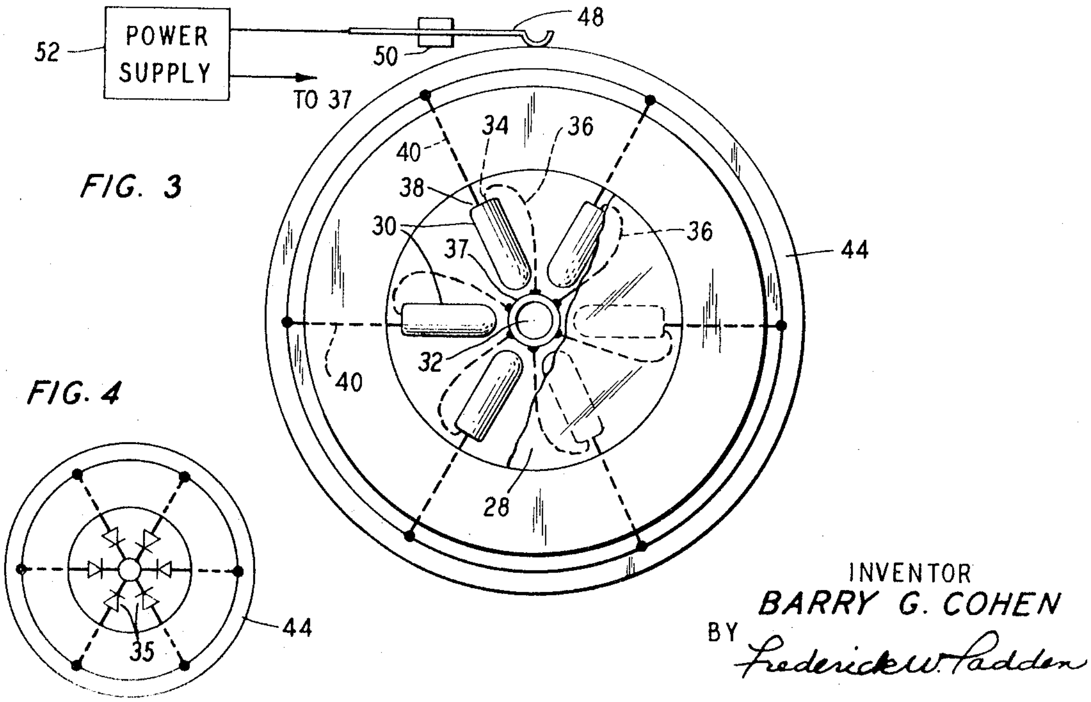
FIG. 3 is a top view, partially cut away, of the illumination assembly shown in FIG. 1 and 2.
FIG. 4 is a top view of another embodiment of my invention utilizing infrared emitting diodes.

As shown in FIGS. 1 and 2, the illumination assembly 14 has a substantially cylindrical disc-like housing adapted to fit into a receiving portion in the upper female surface 22 of chuck assembly 16. To this end the lower male surface 24 of the lamp assembly housing has a shape substantially complementary to the female surface 22. The interior of the housing is an enclosure 27 formed by an annular wall 26, lower surface 24 and a glass window 28 on which the slice 12 is placed. Within the enclosure 27 are a plurality of infrared sources, illustratively incandescent infrared two-terminal lamps 30, disposed along radii extending from center 32 of the circular cylindrical housing. Alternatively, the sources may be infrared light emitting diodes 35 as shown in FIG. 4. One terminal 34 of each lamp 30 is connected via a lead 36 to a ground post 37 located in the center of the enclosure and which extends through the lower surface 24. The other terminals 38 of each of the lamps 30 are connected to separate leads 40 which are passed through separate radial apertures 42 to an annular contact ring 44. The latter is secured to the outer surface of wall 26 typically by means of an insulating casting resin 46. A small contact spring or finger 48, mounted on support means 50, contacts ring 44 on the chuck to connect the lamps to a power supply 52, and thus turn them on when the chuck is in the alignment position.

The lamps 30 as well as the leads 36 (and the portion of the leads 40 within enclosure 27) are secured against accidental movement by means of an insulative plastic 34 which fills the regions beween the lamps but preferably does not entirely cover the lamps. Thus, the plastic provides does not only mechanical stability but also electrical insulation between the lamps leads and the housing where the latter is a conductor.

The embodiment shown in FIG. 3 depicts six lamps in the enclosure 27 for the purpose of illustration only, the actual number of lamps being dictated by design considerations. I have found, however, that six commercially available 1.2 watt incandescent infrared lamps, to produce a total of 7.5 watts of illumination, are adequate for most alignment procedures. Much less power input, typically about 0.5 watts total, is required when IR diodes are used as sources.

It is to be understood that the above-described arrangements are merely illustrative of the many possible specific embodiments which can be devised to represent application of the principles of my invention. Numerous and varied other arrangements can be devised in accordance with these principals by those skilled in the art without departing from the spirit and scope of my invention. In particular, the glass window 28 may optionally be replaced with an IR filter which transmits infrared but absorbs visible radiation. The absorption of visible radiation may be desirable in some applications where the slice 12 is coated with a photosensitive resist material. In such cases the visible radiation may expose the photosensitive resist in areas not intended - under the mask.

It should be noted that my invention permits the illuminator, lamp assembly 14, to be placed directly under the slice 12. This structure has two advantages. First, there is no disruption of the precision spherical surface 16*a* of the chuck nor of the precision translation assembly 18. Consequently, the fine accuracy of the aligner is maintained. In fact, in the Kulicke and Soffa 686 machine previously mentioned, the modified chuck 16 of my invention is positioned on top of the existing ball assembly in place of a solid metal chuck supplied with the machine. Thus, adaption of prior art machines to incorporate my invention is achieved simply and inexpensively. Secondly, the proximity of the lamps and the slice permits large areas of the latter to be illuminated with low total power levels, which in turn virtually eliminates the deleterious effect of thermal gradients on tbe aligner accuracy.

What is claimed is:

1. An illumination device for illuminating a semiconductor slice to be aligned with a patterned mask through precision adjustments of a positioning machine, comprising:

a housing comprising a substantially cylindrical disc-like enclosure with a hollow interior and an open upper surface, said housing including a lower surface portion adapted to be received by at least a portion of said positioning machine, a light transmitting element positioned over the opening in said housing, adapted to support said semiconductor slice and to permit egress of radiant energy from said enclosure through said semiconductor slice and said patterned mask, a first electrical contact made to said housing, and a second electrical contact in the same plane as said housing but electrically insulated from said housing, radiant energy means disposed in said hollow interior, said radiant energy means comprising at least one two terminal radiant energy element, one of said terminals connected to said first contact, and the other of said terminals connected to said second contact.

2. The device of claim 1 wherein: said housing comprises an annular wall having a plurality of apertures extending therethrough; said first contact is centrally located in said enclosure; said second contact comprises an annular member surrounding and affixed to said housing, and including lead means for connecting said annular member to said radiant energy elements, said lead means passing through said apertures.

3. The device of claim 1 wherein said window means comprises an infrared filter, which absorbs visible radiation.

4. For use in the alignment of a semiconductor slice to a patterned mask by means of an alignment machine having a movable chuck member, an illumination device comprising a disc-like, substantially cylindrical housing having a male lower surface portion complementary to, and adapted to be received by, a female upper surface portion of said chuck member, said housing further comprising an annular wall having a plurality of apertures extending radially therethrough and partially enclosing a hollow interior region which has an opening to the exterior of said housing in a direction away from said lower surface portion, an infrared filter window disposed over said opening and adapted to support said semiconductor slice, a contact post centrally located in said hollow interior region and extending through said lower surface portion to the exterior of said housing, an annular contact ring rigidly affixed to the outer surface of said annular wall, and a plurality of two-terminal infrared radiation sources rigidly secured within said interior region, said sources being positioned along separate radii extending from the center of said interior region, one of the terminals of each of said sources being electrically connected to said contact post and the other terminals of said sources being extended through separate ones of said apertures to electrical connection with said annular contact ring, said sources being turned on by the application of voltage between said contact post and said contact ring when said chuck member is in an alignment position, thereby to illuminate said semiconductor slice with infrared radiation.

5. The device of claim 4 where said sources comprise infrared incandescent lamps.

6. The device of claim 14 wherein said sources comprise infrared light emitting diodes.

* * * * *